(12) United States Patent
Looney

(10) Patent No.: US 6,541,295 B1
(45) Date of Patent: Apr. 1, 2003

(54) METHOD OF FABRICATING A WHISPERING GALLERY MODE RESONATOR USING CVD EPI AND A BONDED SILICON WAFER

(75) Inventor: Gary W. Looney, Bordentown, NJ (US)

(73) Assignee: The United States as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/153,493

(22) Filed: May 20, 2002

(51) Int. Cl.[7] .............................................. H01L 21/00
(52) U.S. Cl. .................................................. 438/29
(58) Field of Search ........................ 438/455, 456–459, 438/183, 22–23, 39–41, 29; 331/99, 96; 117/935; 118/728

(56) References Cited

U.S. PATENT DOCUMENTS

| | | | | |
|---|---|---|---|---|
| 4,099,041 A | * | 7/1978 | Berkman et al. ............ 118/728 |
| 4,661,199 A | * | 4/1987 | Looney et al. ............... 117/935 |
| 5,343,490 A | * | 8/1994 | McCall ......................... 372/94 |
| 5,561,314 A | * | 10/1996 | Ema et al. .................... 257/506 |
| 5,652,556 A | * | 7/1997 | Flory et al. ............. 331/107 DP |
| 5,834,981 A | * | 11/1998 | Trier et al. ............... 331/117 D |

* cited by examiner

Primary Examiner—Carl Whitehead, Jr.
Assistant Examiner—Craig Thompson
(74) Attorney, Agent, or Firm—William G. Auton

(57) ABSTRACT

The starting material for this process is a bonded silicon wafer with the appropriate thickness of separating silicon oxide and the appropriate thickness of superficial silicon. The thicknesses are chosen to give the desired operating characteristics of the device. First a masking oxide is formed and holes are opened in the masking oxide having the diameter needed for the pedestal. The holes are then opened down to the separating silicon oxide. If KOH is used then the etch will stop at the oxide automatically. After the silicon etch the oxide is opened to the silicon substrate.

1 Claim, 2 Drawing Sheets

METHOD OF FABRICATING A WHISPERING GALLERY MODE RESONATOR USING CVD EPI AND A BONDED SILICON WAFER

RELATED APPLICATIONS

The application relates to provisional patent application serial No. 60/287,645 by Looney, filed Apr. 30, 2001, which relates to the present application.

STATEMENT OF GOVERNMENT INTEREST

The invention described herein may be manufactured and used by or for the Government for governmental purposes without the payment of any royalty thereon.

BACKGROUND OF THE INVENTION

The present invention relates to whispering gallery mode resonators. More specifically, the present invention is a method of fabricating a whispering gallery mode resonator. CVD wafer fabrication is described in such patents as U.S. Pat. No. 4,661,199 Apr. 28, 1987, entitled: "METHOD TO INHIBIT AUOTDOPING IN EPITAXIAL LAYERS FROM HEAVILY DOPED SUBSTRATES IN CVD PROCESSING"

Method to inhibit audodoping in epitaxial layers from heavily doped substrates in chemical vapor deposition (CVD) processing, Looney, Gary W, which is disclosed herein by reference.

Silicon-based THz sources are based on intersub-banded transitions in SiGe alloy quantum wells on silicon substrates. The Whispering Gallery Mode Resonator structure for a unipolar quantum cascade THz laser is processed in SiGe alloys. The layer thickness is 3 micrometers for the active resonator disk, and 3–7 micrometers for the pedestal height and the disk diameter can range from 50 to 200 micrometers. Heavily doped Silicon layers and selective etching are now used to define the features of this device. This approach can be quite challenging because of the requirement of an extremely heavy doped layer to enhance the etch selectivity.

The above identified Looney patent shows that heavily doped substrates of silicon wafers are inhibited form contaminating by autodoping phenomenon lightly doped epitaxial growing films by providing a thick film of silicon on the susceptor for CVE processing in a radio frequency (RF) powered reactor. The susceptor film of silicon serves to provide a silicon seal to the rear surface of the substrate to prevent or at least inhibit outdiffusion of dopants that that can contaminate the epitaxial film. For example, substrates heavily doped with arsenic, phosphorus or boron at concentrations of $10^{19}$ atoms/cc are inhibited from autodoping contaminating epitaxial films of silicon lightly doped with the same dopant at $10^{14}$ atoms/cc.

In the production of certain semiconductor devices, an epitaxial layer of silicon on a substrate, such as a silicon wafer, is used as the starting material for the devices. The epitaxial layer of silicon is deposited upon the silicon wafer in a chemical vapor deposition (CVD) process wherein the wafer is supported on a silicon carbide-coated graphite susceptor and heated to a high temperature by energy derived from a radio frequency (RF) source. A volatile mixture of silicon is introduced and thermally decomposed or reacted with other gases or vapors at the surface of the wafer to yield silicon which deposits on the wafer surface. Various types of reactors utilizing such RF heated susceptors are well known in the art. One such susceptor utilized in a barrel reactor is described in U.S. Pat. No. 4,099,041, issued to S. Berkman et al on Jul. 4, 1978, entitled "Susceptor Structure for Heating Semiconductor Substrates".

In recent applications of semiconductor devices, particularly those used for high power circuits, there has been a need to provide a precise and restricted range of resistivity values of the epitaxial layers grown on heavily doped substrates.

As mentioned above, silicon-based THz sources are based on intersub-banded transitions in SiGe alloy quantum wells on silicon substrates. The Whispering Gallery Mode Resonator structure for unipolar quantum cascade THz lasers in processed in SiGe alloys. The layer thickness is 3 micrometers for the active resonator disk, and 3–7 micrometers for the pedestal height and the disk diameter can range from 50 to 200 micrometers. Heavily doped silicon layers and selective etching are now used to define the features of this device. This approach can be quite challenging because of the requirement of an extremely heavy doped layer to enhance the etch selectivity.

Samples of current whispering gallery mode resonator technology are described in the following U.S. Patents which are incorporated herein by reference:

U.S. Pat. No. 5,834,981, Nov. 10, 1998, entitled "Whispering gallery mode dielectric resonator oscillator circuit," Trier, Marc, U.S. Pat. No. 5,652,556, Jul. 29, 1997, entitled "Whispering gallery-type dielectric resonator with increased resonant frequency spacing, improved temperature stability, and reduce microphny," Flory, Curt Alan.

The present invention describes a novel process using the silicon oxide of a semiconductor on insulator (SOI) bonded silicon wafer as the etch medium which will be selectively removed to form the microdisk. SOI bonded silicon wafers are now being used in CMOS fabrication and have very low defect densities. When using KOH based etches, the oxide has essentially 100% selectivity with silicon, and normal silicon semiconductor fabrication procedures can be used to define the device, with precise control over all dimensions.

SUMMARY OF THE INVENTION

This disclosure describes a novel approach using the silicon oxide of an SOI bonded silicon wafer as the etch medium which will be selectively removed to form a microdisk for whispering gallery mode resonator. SOI bonded silicon wafers are now being used in CMOS fabrication and have very low defect densities. When using KOH based etches, the oxide has essentially 100% selectivity with silicon, and normal silicon semiconductor fabrication procedures can be used to define the device, with precise control over all dimensions.

The starting material for this process is a bonded silicon wafer with the appropriate thickness of separating silicon oxide and the appropriate thickness of superficial silicon. The thicknesses are chosen to give the desired operating characteristics of the device. First a masking oxide is formed and holes are opened in the masking oxide having the diameter needed for the pedestal. The holes are then opened down to the separating silicon oxide. If KOH is used then the etch will stop at the oxide automatically. After the silicon etch the oxide is opened to the silicon substrate.

Using CVD selective epitaxial (EPI) holes are then filled to the original surface of the superficial silicon, essentially forming the pedestal of the microdisk.

After stripping the masking oxide active regions of silicon and/or SiGe are formed at the appropriate thickness for the device, via CVD and/or molecular beam epitaxy (MBE). A new masking oxide is then deposited and a new mask level is aligned to the pedestals and defines the microdisk, moats are etched around the pedestal area having the diameter of the microdisc. These moats are etched down to the separating oxide. The oxide is then removed with an oxide etch which under cuts the microdisk and creates a cavity back to the pedestal.

BRIEF DESCRIPTION OF THE DRAWINGS

The teachings of the present invention can be readily understood by considering the following detailed description in conjunction with the accompanying drawings, in which.

DESCRIPTION OF THE PREFERRED EMBODIMENT

Figure 1:
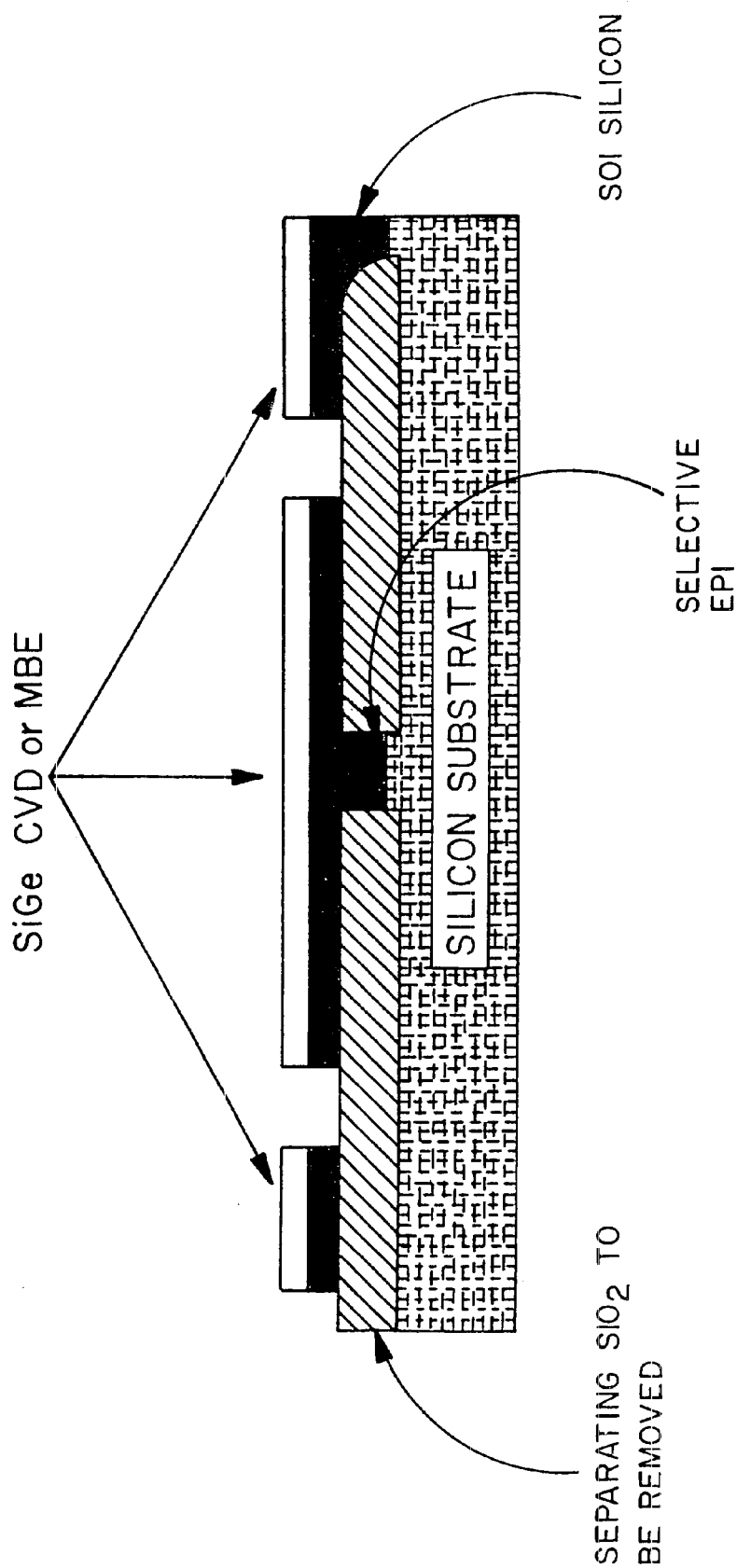
FIG. 1 is a schematic diagram showing a cross-section of a silicon wafer before etch processing.

The material used in the present invention is a bonded silicon wafer with the appropriate thickness of separating silicon oxide and the appropriate thickness of superficial silicon. Please refer to FIG. 1. The thicknesses are chosen to give the desired operating characteristics of the device. First a masking oxide is formed and holes are opened in the masking oxide having the diameter needed for the pedestal. The holes are then opened down to the separating silicon oxide. If KOH is used, then the etch will stop at the oxide automatically. After the silicon etch, the oxide is opened to the silicon substrate.

Figure 2:
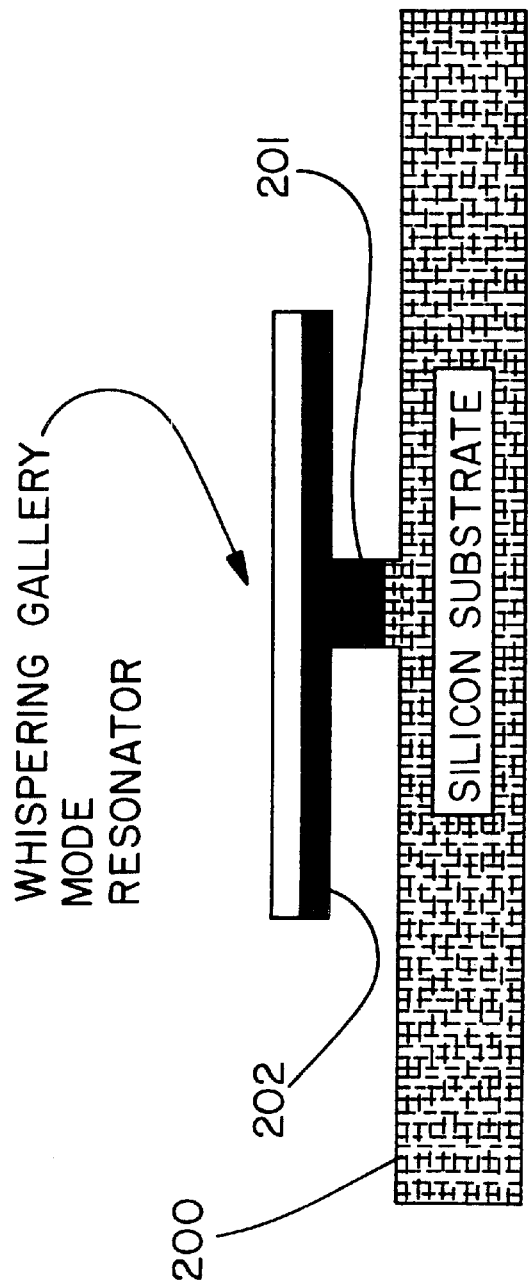
FIG. 2 is a schematic diagram showing the corss-section of FIG. 1, wherein the etch process has been performed.

Using CVD selective EPI, the holes are then filled to the original surface of the superficial silicon, essentially forming the pedestal of the microdisk. See FIG. 2. After stripping, the masking oxide active regions of silicon and/or SiGe are formed at the appropriate thickness for the device, via CVD and/or MBE. A new masking oxide is then deposited and a new mask level is aligned to the pedestals and defined the microdisk, moats are etched around the pedestal area having the diameter of the microdisk. These moats are etched down to the separating oxide. The oxide is then removed with an oxide etch which undercuts the microdisk and creates a cavity back to the pedestal.

The present invention is a process of fabricating a whispering gallery mode resonator structure in a bonded silicon wafer. This process includes the steps of:

depositing an $SIO_2$ masking oxide on said bonded silicon wafer using CVD epitaxial deposition to form a pattern of geometry of the Whispering Gallery Mode Resonator with; a base, pedestal and cap of bonded silicon surrounded by the $SIO_2$ masking oxide; and etching out the $SIO_2$ masking oxide to leave behind the base, pedestal and cap of the Whispering Gallery Mode Resonator.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process of fabricating a whispering gallery mode resonator structure in a bonded silicon wafer, said process comprising the steps of:

a first masking etch step in which an $SIO_2$ masking oxide forms holes in a bonded (SOI) silicon for subsequent deposition of epitaxial silicon to form a pedestal;

a first deposition step entailing a deposition of epilaxial silicon to form a pedestal;

a first etching step entailing etching away the $SIO_2$ masking oxide to leave behind a pedestal structure;

a second masking step in which $SIO_2$ masking oxide defines a microdisk and moats for under etching the bonded (SOI) silicon for forming the whispering galley mode generator; and a second etching step which entails etching away the $SIO_2$ masking oxide to leave behind the whispering gallery mode generator.

* * * * *